(12) United States Patent
Newman, Jr.

(10) Patent No.: US 7,866,261 B2
(45) Date of Patent: Jan. 11, 2011

(54) METAL STENCIL FOIL ATTACHMENT TO SCREEN MESH

(75) Inventor: Eugene Frank Newman, Jr., Columbus, OH (US)

(73) Assignee: Rapid Screen Products Corporation, Canal Winchester, OH (US)

( * ) Notice: Subject to any disclaimer, the term of this patent is extended or adjusted under 35 U.S.C. 154(b) by 877 days.

(21) Appl. No.: 11/752,919

(22) Filed: May 23, 2007

(65) Prior Publication Data
US 2008/0289519 A1    Nov. 27, 2008

(51) Int. Cl.
*B41L 13/00*    (2006.01)
*B41C 1/14*    (2006.01)
(52) U.S. Cl. .................. 101/128.1; 101/128.4
(58) Field of Classification Search .......... 101/127, 101/127.1, 128.1, 128.4
See application file for complete search history.

(56) References Cited

U.S. PATENT DOCUMENTS

| 3,769,908 | A | * | 11/1973 | Griffin | 101/127 |
| 4,134,340 | A | * | 1/1979 | Larson | 101/127.1 |
| 4,854,230 | A | * | 8/1989 | Niki et al. | 101/123 |
| 5,522,314 | A | * | 6/1996 | Newman, Jr. | 101/128.4 |
| 5,749,292 | A | * | 5/1998 | De Bastiani et al. | 101/129 |
| 6,286,424 | B1 | * | 9/2001 | Kinoshita | 101/129 |
| 6,561,089 | B1 | * | 5/2003 | Newman, Jr. | 101/127.1 |
| 7,513,914 | B2 | * | 4/2009 | Schurr | 623/23.65 |

* cited by examiner

*Primary Examiner*—Judy Nguyen
*Assistant Examiner*—Leo T Hinze
(74) *Attorney, Agent, or Firm*—Porter, Wright, Morris & Arthur, LLP

(57) ABSTRACT

Methods and apparatuses for attaching metal stencil foils to screen mesh using thermoplastic materials. Mechanical, rather than adhesive, attachment of metal stencil foils to screen mesh is accomplished by melting thermoplastic material so as to encapsulate portions of metal stencil foils and screen mesh resulting in faster, less expensive, and more durable bonding.

12 Claims, 5 Drawing Sheets

METAL STENCIL FOIL ATTACHMENT TO SCREEN MESH

FIELD OF THE INVENTION

This invention relates in general to attaching stencils to screen mesh and in particular to attaching metal stencil foils to screen mesh for printing solder paste onto electronic circuit boards.

DESCRIPTION OF RELATED ART

Current practice in surface mount technology is to use stencils made of metal foil having laser cut apertures in a prescribed pattern through which solder paste is printed onto circuit boards. The printed circuit boards (PCBs) are used to mount and connect various components making up electronic circuits. The metal foil stencils must be tightly stretched to squeegee solder paste through the apertures of the stencil onto circuit boards. The circuit board is preferably slightly off contact from and parallel with the bottom surface of the stencil. In order to stretch the stencil, one current practice is to mount the stencil to a tensioning frame having internal mechanisms that pull the metal stencil taut. Two examples of this are "Wizard" stencils and frames made by Quick Tensioning Systems, Incorporated of Medford, Mass. and VectorGuard stencils and frames made by DEK Printing Machines, Ltd of Weymouth, England. Another practice is to stretch and glue a screen mesh, such as used in the screen printing industry, to a frame. The metal stencil foil, which has peripheral apertures around the perimeter to assist in gluing, is then glued to the screen mesh. After gluing, screen mesh inside the glued perimeter of the stencil is cut away so as not to interfere with printing.

Metal foil stencils attached to screen mesh have advantages over metal foil stencils stretched on tensioning frames without screen mesh. The screen mesh gives the stencil increased resiliency or "peel", as it is sometimes called, as a squeegee moves across the stencil. If the stencil is slightly off contact from the circuit board, the squeegee can force the stencil to flex just enough to touch the circuit board along the point of contact of the squeegee blade as solder paste slips through apertures onto the circuit board. The off contact between the stencil and the circuit board is bridged only momentarily along the line of the moving squeegee blade. Preferably, the stencil will snap back or "peel" from the circuit board as the squeegee blade crosses the stencil. The screen mesh provides elasticity which helps the stencil to touch the substrate at the precise moment of printing.

Although the print mechanics of screen stencils may be better than those of screen-less stencils, there are problems with screen stencils. One problem is that metal stencil foil is glued to the screen mesh. Gluing is labor intensive and curing of the glue can sometimes take hours. Although heating ovens can speed up the curing process, the gluing operation is a constraint on the stencil maker's ability to make stencils in a timely manner. Another problem with gluing is that the glue can sometimes become un-bonded when exposed to cleaning solvents used to clean metal stencils.

In U.S. Pat. No. 6,561,089, a process is described of attaching polypropylene plastic strips to screen mesh for the screen printing industry. This patent teaches that polypropylene can be attached to screen mesh by melting the polypropylene into and throughout the web of woven threads that composes screen mesh. In this patent it is taught how polypropylene having a hook-like shape can be attached to screen mesh so the screen mesh can be stretched and hooked onto sides of a frame. This patent does not address metal stencil foils having exceptionally smooth solid surfaces.

In current practice, both the screen mesh and the glue are on the squeegee side of the stencil opposite the print side that comes in contact with the circuit board. Glue goes into, but not completely through, peripheral stencil apertures during gluing. Since both the glue and the screen mesh are on the non-print side of the stencil, a flat glue-less surface is presented to the circuit board during printing. By gluing the screen mesh to one side of the stencil, the glue makes a better bond to the screen mesh than if the glue were to go through the stencil apertures into screen mesh on the opposite side of the stencil. The surface area of screen mesh that can be glued is greater if the glue and the mesh are on the same side of the stencil. Because of the adhesiveness of glue, such as epoxy glue, an adhesive bond, not a mechanical bond, is made to the screen mesh and the smooth surface of the metal stencil foil. Although peripheral apertures are added to the stencil to enhance bonding, it is the practice to glue into the apertures to only the thickness of the stencil and not to glue onto the opposite side of the stencil, especially not into a material on the opposite side of the stencil.

Presently, there is no commercial activity in the surface mount technology industry in which a thermoplastic material is used to attach a metal stencil foil to screen mesh. It has either not been considered or has not been thought feasible to attach a metal foil stencil to screen mesh using a thermoplastic material.

SUMMARY OF THE INVENTION

An objective of the present invention, using mechanical bonding material able to be melted by moderate heating and able to harden after heating, is to teach a method to securely attach metal stencil foils to screen mesh that is faster, less expensive, and more durable than current methods of gluing.

Thermoplastic materials, such as polypropylene, are suitable mechanical bonding materials which, as will be shown, can be used to mechanically attach metal stencil foils and screen mesh securely together. They are also much more resistant to attack from cleaning solvents than epoxy glues.

The present invention comprises the mechanical attachment of a metal stencil foil having apertures along its periphery to a screen mesh in which a thermoplastic material, such as polypropylene, is softened and melted so as to flow into and through the peripheral apertures into a screen mesh in proximity to the apertures such that when the thermoplastic material is cooled and hardened, a mechanical attachment is made between the metal stencil foil and the screen mesh.

In the vertical plane, an effective attachment has been found when the screen mesh is laid on top of the metal stencil foil and the thermoplastic material is laid below the metal stencil foil in a template while heat and pressure are applied downwardly from above onto this assembly. If the metal stencil foil is laid on top of the screen mesh and the thermoplastic material is below the screen mesh while heat and pressure are applied downwardly onto the assembly, a much weaker attachment results. Therefore, it is preferable to have the screen mesh layered over the metal stencil foil with the thermoplastic material below the metal stencil foil. In the horizontal plane, the metal stencil foil, having peripheral apertures, is positioned over the thermoplastic material, having a length and width greater than the metal stencil foil and a large central open area, such that each edge of the metal stencil foil lies within the length and width of the thermoplastic material and the peripheral apertures of the metal stencil foil lie outwardly of the larger central opening of the thermoplastic material. Thus positioned, when heat and pressure are applied downwardly from above, the thermoplastic material softens and flows upwardly into the screen mesh to the outside of the stencil and through the apertures inside of the metal stencil foil into the overhead screen mesh. The thermoplastic material adheres to and encapsulates the screen mesh. After the heat and pressure are removed, the thermoplastic material cools and becomes rigid and the attachment is complete. The screen mesh can now be cut away inwardly of the peripheral bonding so the stencil can print without interference from the screen mesh. The rigid thermoplastic material on one side of the stencil fastened through the apertures to the screen mesh on the opposite side of the stencil and through the screen mesh just to the outside of the stencil mechanically locks the stencil onto the screen. The thermoplastic material does not adhere well to the metal stencil so adhesion plays only a minor role in the attachment. Mechanical attachment is achieved by the thermoplastic material penetrating through the stencil apertures and gripping into screen mesh above the stencil and by thermoplastic material gripping into the screen mesh along the outside edges of the stencil. These areas of attachment are anchored to a solid layer of thermoplastic material on the squeegee side of the stencil. The stencil is held fast within the grasp of the thermoplastic material and screen mesh surrounding the stencil edges.

Effective attachment can also be attained when limiting the thermoplastic material to the stencil areas in proximity to the stencil apertures so as to exclude the area adjacent to and outwardly of the stencil edges, although this is not preferred.

The screen mesh can be stretched and attached to a frame before the stencil attachment process or after the attachment process, but in either case, when the stencil, screen, and frame are later used in printing, the assembly is turned over so the screen mesh is on the bottom facing the circuit board. Although the screen mesh and thermoplastic material encapsulating the screen mesh stick out from the bottom surface of the stencil, the thinness of this protrusion mitigates interference with printing.

In various embodiments of the present invention, screen mesh may be stretched to a prescribed tension on a stretcher device or stretched to a prescribed tension and attached to a frame before the stencil is attached. Upon releasing the screen mesh from the stretcher device or from the frame, as is possible with some frame systems, the stencil may bow upon relaxation of the tension in the screen mesh. Screen mesh contracts to a smaller size when it relaxes after being stretched. Screen threads running parallel with the stencil edges, as they contract, pull the stencil into a bowed shape because when the stencil originally went onto the screen, the screen was stretched to an expanded size but the stencil was relaxed and not expanded. The bowing may be considered undesirable. In another embodiment of the present invention, the stencil is attached first to a relaxed or un-stretched screen mesh. When the screen is stretched to an expanded size and mounted on the frame, the stencil also is stretched and expanded. If the screen is taken off the frame and relaxed again, the stencil also relaxes into its original smaller size and consequently there is less bowing even though the degree of expansion between the two materials may be considerable.

A method of attaching a stencil, having peripheral apertures, to screen mesh using thermoplastic material, having greater length and width compared to the length and width of said stencil and having a large central open area, comprises the steps of;

1. placing the thermoplastic material in a template and positioning the stencil over the thermoplastic material such that each edge of the stencil lies within the length and width of the thermoplastic material and the apertures of the stencil are outwardly of the large central opening of the thermoplastic material,
2. placing a stretched screen mesh on a stretcher device or on a frame over the assembled thermoplastic material and stencil,
3. applying sufficient heat and pressure to soften or melt the thermoplastic material and force the thermoplastic material into the apertures of the stencil and into openings of the screen mesh above the apertures and above the thermoplastic material to the outside of the stencil,
4. removing the heat and pressure so as to cool and harden the thermoplastic material.

A second method of the present invention comprises the steps of the first method except that in step 2 an un-stretched screen rather than a stretched screen mesh is used.

A third method of attaching a stencil, having peripheral apertures, to screen mesh using thermoplastic material, having lesser or equal length and width compared to the length and width of said stencil and having a large central open area, comprises the steps of;

1. placing the thermoplastic material in a template and positioning the stencil over the thermoplastic material such that the peripheral apertures of the stencil lie outside the large central opening of the thermoplastic material,
2. placing a stretched screen mesh on a stretcher device or on a frame over the assembled thermoplastic material and stencil,
3. applying sufficient heat and pressure to soften or melt the thermoplastic material and force the thermoplastic material into the apertures of the stencil and into openings of the screen mesh above the apertures of the stencil,
4. removing the heat and pressure so as to cool and harden the thermoplastic material.

A fourth method of the present invention comprises the steps of the third method except in step 2 an un-stretched screen rather than a stretched screen mesh is used.

Laser cutting of print apertures in the interior of the metal stencil foil can occur before or after the metal stencil foil is attached to the screen mesh. dr

DETAILED DESCRIPTION

Figure 1:
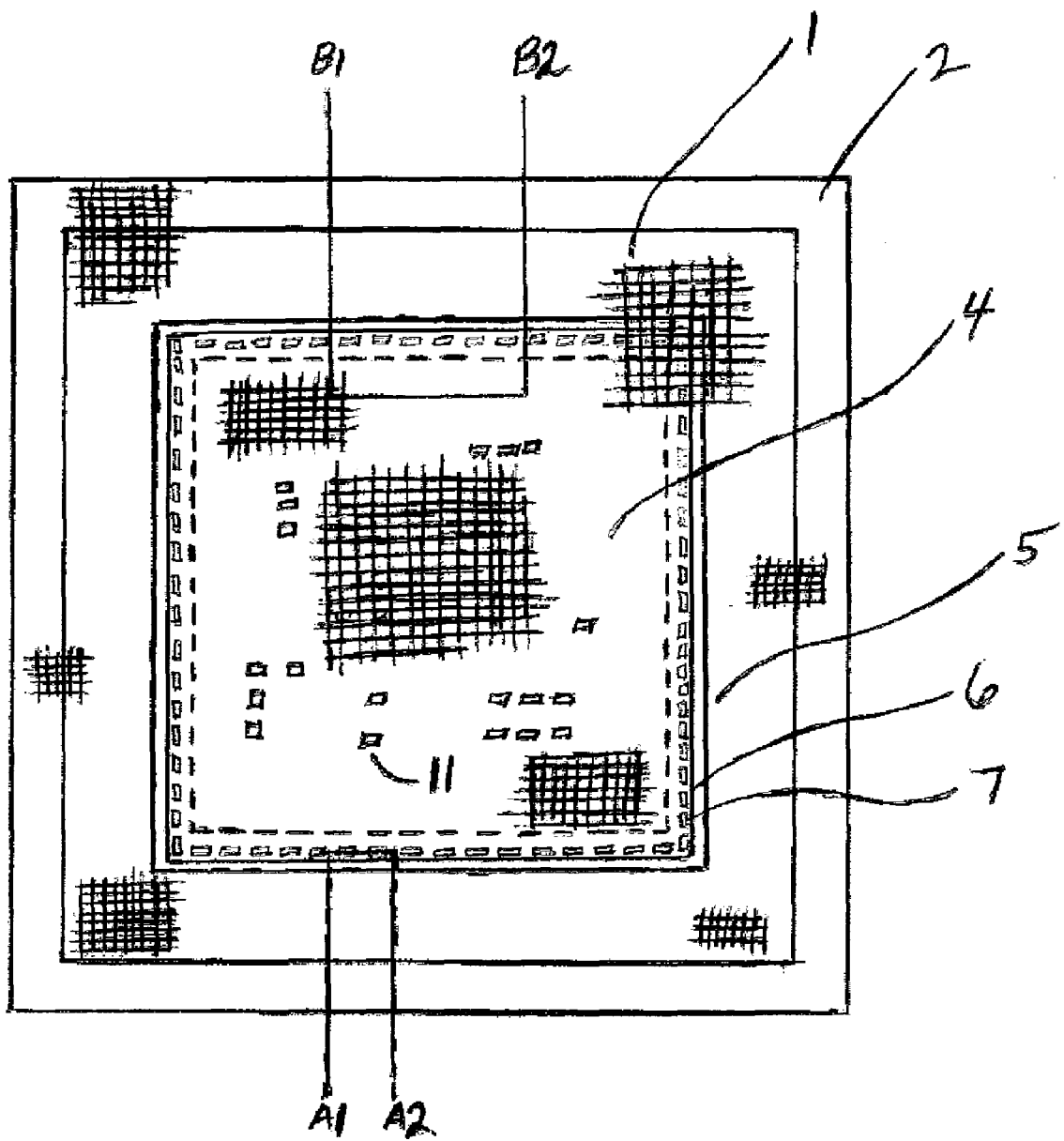
FIG. 1 is an overhead view of the screen of the present invention stretched and mounted on a frame with the stencil and thermoplastic material of the present invention positioned under the screen.
Figure 2:
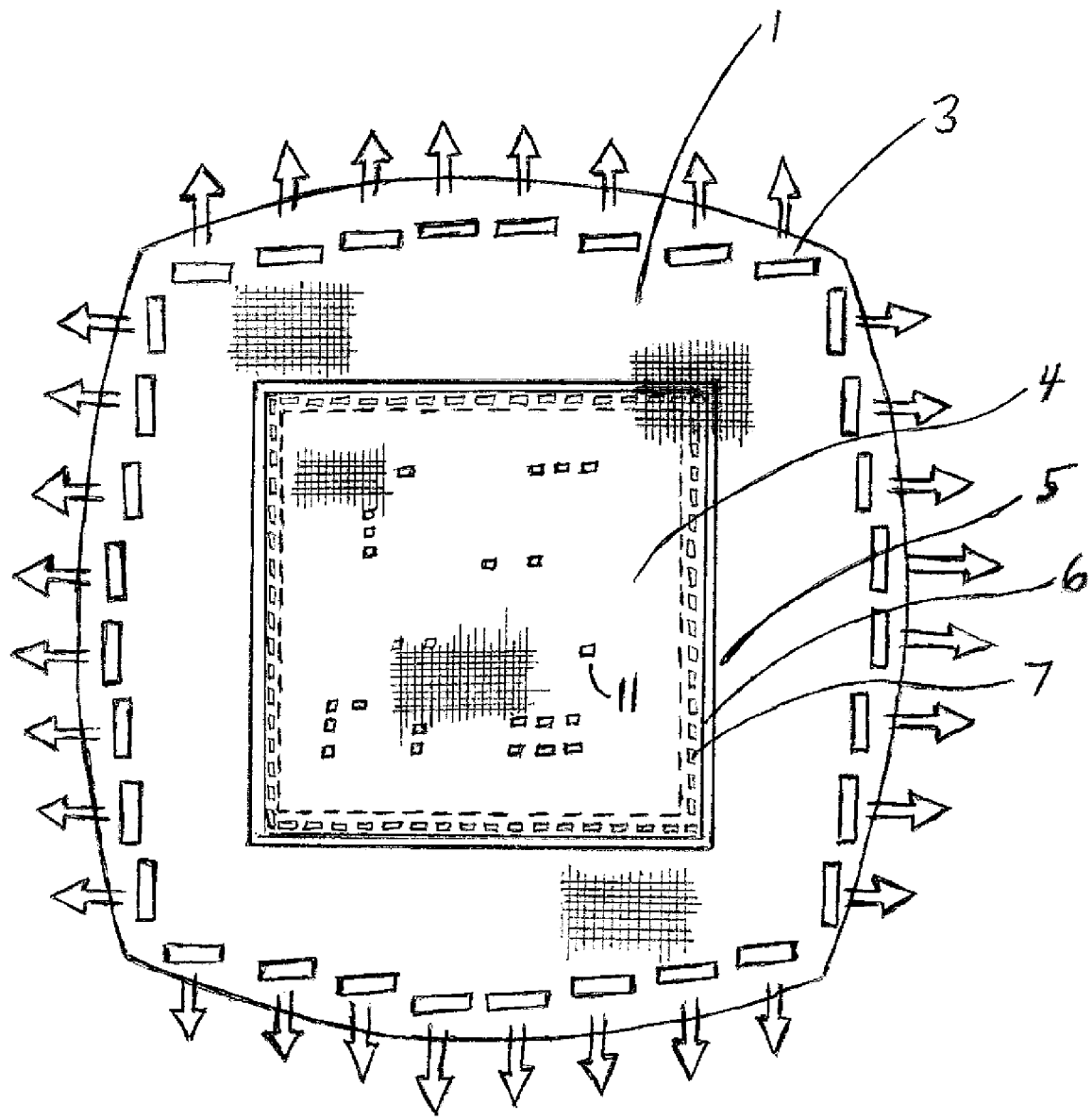
FIG. 2 is an overhead view of the screen of the present invention clamped to and stretched by a stretching device with the stencil and thermoplastic material of the present invention positioned under the screen.
Figure 3:
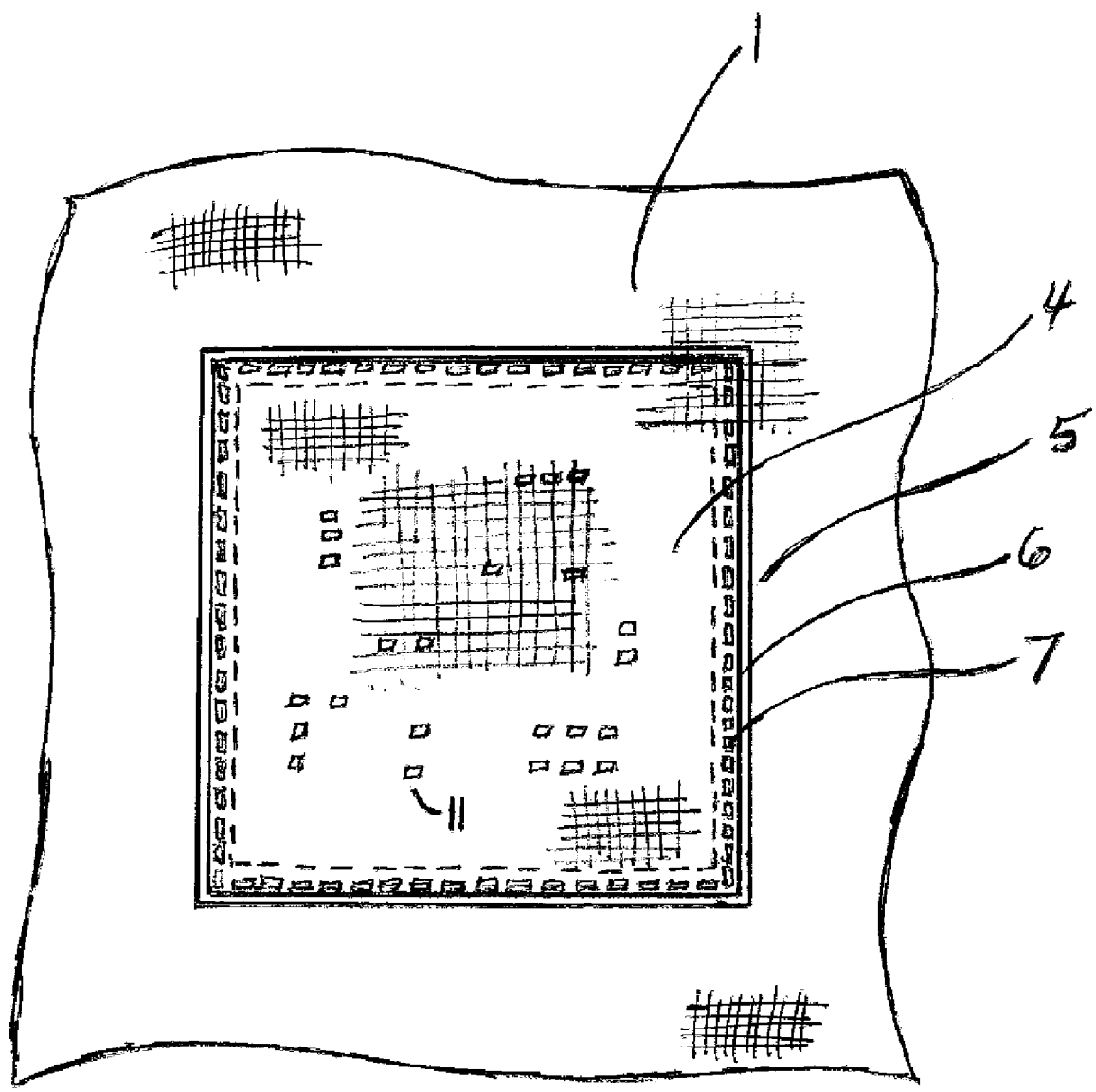
FIG. 3 is an overhead view of a sheet of relaxed screen mesh of the present invention with the stencil and thermoplastic material of the present invention positioned under the screen mesh.
Figure 4:
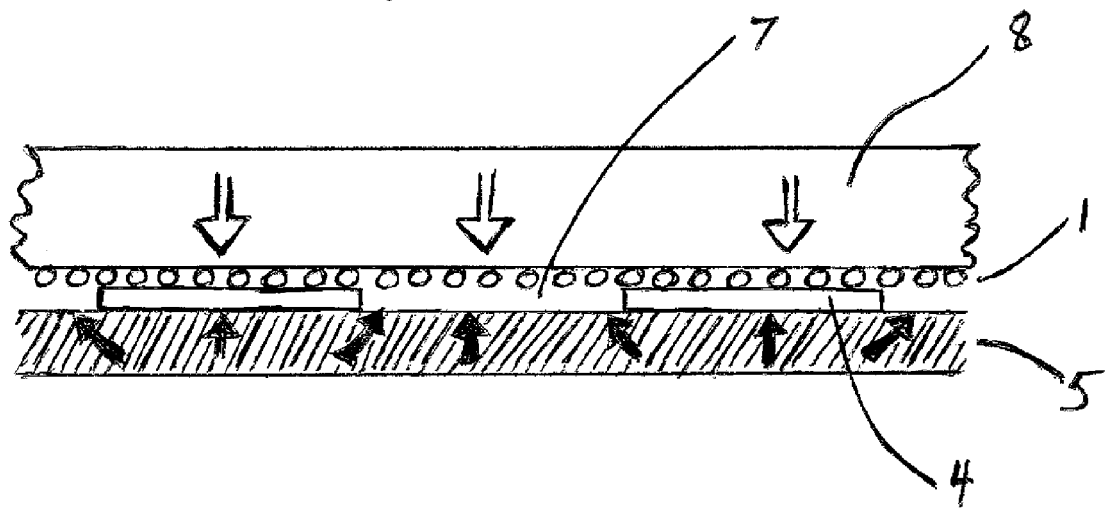
FIG. 4 is a cross sectional view along line A1-A2 of FIG. 1 of the screen, stencil, thermoplastic material of the present invention, and the heat platen of the present invention in the descending mode.

In the present invention a screen mesh 1 of FIGS. 1, 2, and 3 may be stretched and attached on a frame 2 of FIG. 1, attached to and stretched by clamps 3 of FIG. 2, or laid out flat in a relaxed state as in FIG. 3 while covering a metal stencil foil 4. Foil 4 in the preferred embodiment of the present invention is positioned to lie over thermoplastic material 5 along edges 6 of foil 4. Foil 4 comprises peripheral apertures 7 along edges 6 of foil 4 that are positioned over thermoplastic material 5. While screen mesh 1, metal stencil foil 4, and thermoplastic material 5 are positioned one on top of the other, a heated platen 8 of FIG. 4 descends forcefully onto the layered assembly. Platen 8 must be hot enough to soften and melt thermoplastic material 5 without damaging screen mesh 1. If thermoplastic material 5 is polypropylene and screen mesh 1 is made of polyester, which is a common screen material, a platen temperature of 335 to 395 degrees Fahrenheit is acceptable. Platen 8 upon descending onto the assembly, in addition to having a prescribed temperature, must apply a prescribed downward force for a prescribed dwell time in order to soften and melt thermoplastic material 5 sufficient for it to flow. Because platen 8 is pushing downwardly with force against the assembly, which includes thermoplastic material 5, the assembly will push back with an equal opposite force. This upward force drives softened and melted thermoplastic material 5 upwardly filling apertures 7 and area 9 of FIG. 6 where thermoplastic material 5 extends beyond edges 6 of stencil 4. The softened and melted thermoplastic material 5 given adequate force, dwell time, and heat continues upwardly into openings in the woven web of screen mesh 1. With adequate force, dwell time and temperature, the thermoplastic material will encapsulate screen mesh I above and in proximity to apertures 7 and foil edges 6. With a sufficient flow of thermoplastic, the thermoplastic will spill over beyond the periphery of apertures 7 and foil edges 6 creating a seal. Depending on the distance between apertures 7 as well as the downward force of the platen, the dwell time and the temperature of the platen, this flow can partially or completely encapsulate screen mesh 1 in proximity to apertures 7 and foil edges 6. Platen 8, which can be made of metal, is a barrier preventing softened and melted thermoplastic material from rising to any great degree above screen mesh 1, but it does not prevent it from taking the path of least resistance sideways through the weave of screen mesh 1 so as to infiltrate and encapsulate thermoplastic material 5. Placing a sheet of vellum paper (not shown), or the like, between platen 8 and screen mesh 1 prior to the descent in order to prevent melted thermoplastic material from sticking to platen 8.

Figure 5:
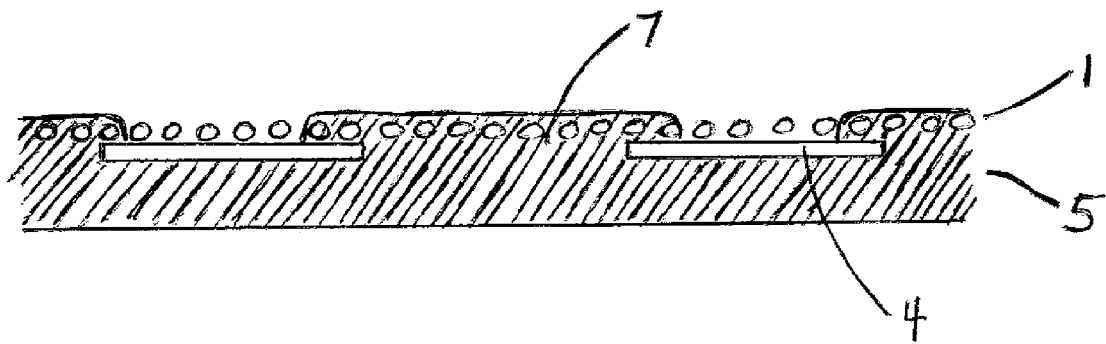
FIG. 5 is a cross sectional view along line A1-A2 of FIG. 1 of the screen, stencil, thermoplastic material of the present invention, and the heat platen of the present invention in the ascending mode.

In FIG. 5, platen 8 is in the ascending mode after the prescribed dwell time. Thermoplastic material 5 has flowed up through apertures 7 and has encapsulated screen mesh 1 not only directly above apertures 7 but also over foil 4 in close proximity to apertures 7. Given sufficient force, dwell time, and heat, the flow of thermoplastic 5 sideways through screen mesh 1 would have been enough to link together and completely encapsulate screen mesh 1 over the peripheral areas of foil 4 if apertures 7 and foil edges 6 were not too widely spaced apart. As platen 8 ascends, as shown in FIG. 5, thermoplastic material 5 cools and hardens forming a rigid mechanical grip, over, around, and through metal stencil foil 4 that attaches it to screen mesh 1 even after screen mesh 1 is cut away along line 10 in FIG. 6 to permit solder to be printing through print apertures 11 of metal stencil foil 4.

Figure 6:
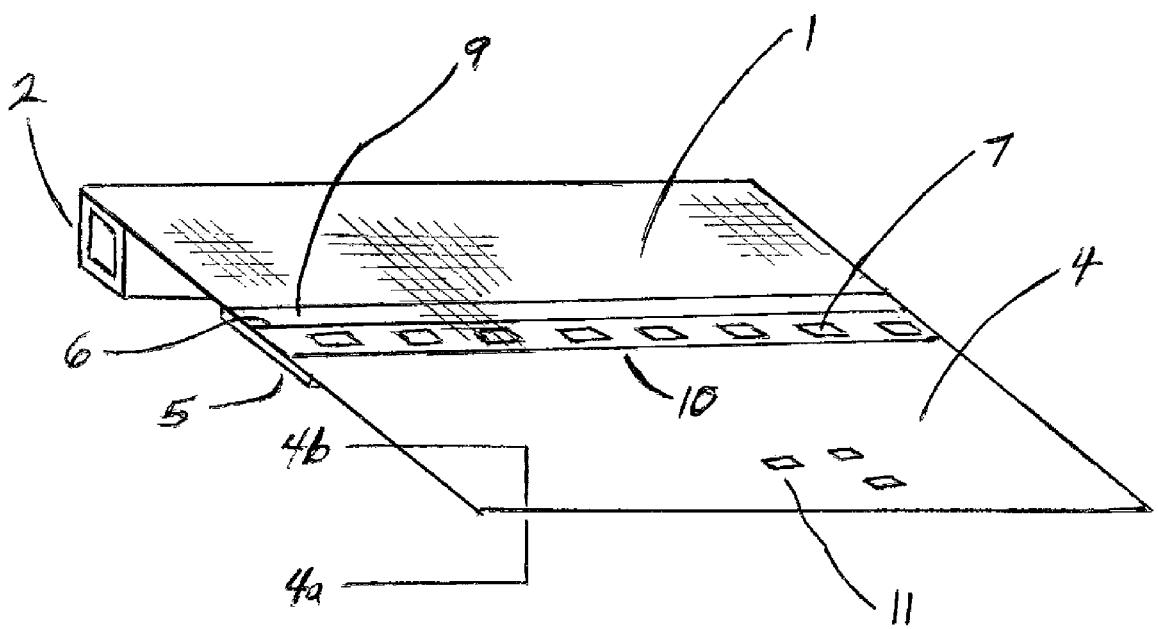
FIG. 6 is a perspective view of a section of the screen, stencil, and thermoplastic material of the present invention bounded by line B1-B2.

Experimentation has shown that a strong mechanical grip is created when apertures 7 provide enough open area for thermoplastic material 5 to flow in sufficient amounts to provide a good mechanical grip of metal stencil foil 4. Unlike glues, which rely more on adhesion to hold stencil 4 to screen mesh 1, the present invention relies much more on a mechanical grip to attach these materials. Moving screen mesh 1 from squeegee side 4a of stencil 4, as in adhesive bonding, to print side 4b of stencil 4, as in the present invention, reduces the adhesive bonding potential of stencil 4 and screen mesh 1 while increasing the potential for mechanically grip (FIG. 6 shows the print side of stencil 4 facing upward. During actual printing it faces downward).

As a result of thermoplastic material 5 adjacent to apertures 7 on squeegee side 4a of stencil 4 penetrating through apertures 7 and fastening to screen mesh 1 on print side 4b and as a result thermoplastic material 5 on squeegee side 4a of foil 4 penetrating into and fastening to screen mesh 1 adjacent to and outside of stencil edges 6, a strong attachment of stencil 4 to screen mesh 1 is formed.

The foregoing descriptions of the preferred embodiments of the invention have been presented for the purpose of illustration and description. It is not intended to be exhaustive or to limit the invention to the precise forms described. Many modifications and variations are possible in light of the above teaching. It is intended that the scope of the invention be limited not by this detailed description, but rather by the claim appended here to.

What is claimed is:

1. A stencil assembly comprising:
    a. a metal stencil foil having edges and peripheral apertures along said edges,
    b. a mechanical bonding material on one side of said metal stencil foil inwardly of and along said edges of said metal stencil foil,
    c. a screen mesh on a side of said metal stencil foil opposite to said mechanical bonding material,
    d. a portion of said mechanical bonding material filling said peripheral apertures of said metal stencil foils and encapsulating said screen mesh in proximity to said peripheral apertures,
    whereby said metal stencil foil is mechanically attached to said screen mesh.

2. The stencil assembly of claim 1 in which said mechanical bonding material is a thermoplastic material.

3. The stencil assembly of claim 2 in which said mechanical bonding material is a polypropylene.

4. The stencil assembly of claim 1 in which said mechanical bonding material extends outside the edges of said metal stencil foil whereby portions of said mechanical bonding material outside the edges of said metal stencil foil encapsulate said screen mesh.

5. A method of attaching a metal stencil foil, having peripheral apertures, to screen mesh using a mechanical bonding material, having greater length and width than the length and width of said metal stencil foil and having a large central open area, said method comprising the steps of;
    a. placing said mechanical bonding material in a template and positioning said metal stencil foil such that each edge of said metal stencil foil lies within the length and width of said mechanical bonding material and said apertures of said metal stencil foil are outward of said large central opening of said mechanical bonding material,
    b. placing said screen mesh over said metal stencil foil and said mechanical bonding material,
    c. applying sufficient heat and pressure to soften or melt said mechanical bonding material and force said mechanical bonding material into said apertures of said metal stencil foil and into openings of said screen mesh above said apertures and above said mechanical bonding material to the outside of said metal stencil foil, d. removing said heat and pressure so as to cool and harden said mechanical bonding material.

6. The method of claim 5 wherein said method comprises a first step of stretching and mounting said screen mesh to a prescribed tension on a frame.

7. The method of claim 5 wherein said method comprises a first step of stretching said screen mesh to a prescribed tension on a stretching device.

8. The method of claim 5 wherein said screen mesh is not stretched.

9. A method of attaching a metal stencil foil, having peripheral apertures, to screen mesh using a mechanical bonding material, having a length and width less than or equal to the length and width of said metal stencil foil and having a large central open area, said method comprising the steps of;

a. placing said mechanical bonding material in a template and positioning said metal stencil foil such that each edge of said metal stencil foil lies within the length and width of said mechanical bonding material and said apertures of said metal stencil foil are outward of said large central opening of said mechanical bonding material, b. placing said screen mesh over said metal stencil foil and said mechanical bonding material, c. applying sufficient heat and pressure to soften or melt said mechanical bonding material and force said mechanical bonding material into said apertures of said metal stencil foil and into openings of said screen mesh above said apertures and above said mechanical bonding material to the outside of said metal stencil foil, d. removing said heat and pressure so as to cool and harden said mechanical bonding material.

10. The method of claim 9 wherein said method includes a first step of stretching and mounting said screen mesh to a prescribed tension on a frame.

11. The method of claim 9 wherein said method includes comprises a first step of stretching said screen mesh to a prescribed tension on a stretching device.

12. The method of claim 9 wherein said screen mesh is not stretched.

* * * * *